(12) United States Patent
Hu et al.

(10) Patent No.: US 10,782,538 B2
(45) Date of Patent: Sep. 22, 2020

(54) LENS DRIVING DEVICE

(71) Applicant: TDK TAIWAN CORP., Taoyuan (TW)

(72) Inventors: Chao-Chang Hu, Taoyuan (TW); Chen-Chi Kuo, Taoyuan (TW)

(73) Assignee: TDK TAIWAN CORP., Yangmei Taoyuan (TW)

( * ) Notice: Subject to any disclaimer, the term of this patent is extended or adjusted under 35 U.S.C. 154(b) by 0 days.

(21) Appl. No.: 16/445,962

(22) Filed: Jun. 19, 2019

(65) Prior Publication Data

US 2019/0302473 A1 Oct. 3, 2019

Related U.S. Application Data

(63) Continuation of application No. 15/658,869, filed on Jul. 25, 2017, now Pat. No. 10,365,500.

(Continued)

(30) Foreign Application Priority Data

Jul. 13, 2017 (CN) .......................... 2017 1 0570216

(51) Int. Cl.
*G02B 27/64* (2006.01)
*G02B 7/08* (2006.01)
(Continued)

(52) U.S. Cl.
CPC ............. *G02B 27/646* (2013.01); *G02B 7/08* (2013.01); *G02B 7/09* (2013.01); *G03B 3/10* (2013.01);
(Continued)

(58) Field of Classification Search
CPC .......... G02B 7/00; G02B 7/004; G02B 7/005; G02B 7/008; G02B 7/02; G02B 7/023;
(Continued)

(56) References Cited

U.S. PATENT DOCUMENTS

| 8,818,181 B1 | 8/2014 | Hwang et al. |
| 2001/0022688 A1 | 9/2001 | Kosaka et al. |

(Continued)

FOREIGN PATENT DOCUMENTS

WO WO2016/009200 A1 1/2016

*Primary Examiner* — Robert E. Tallman
(74) *Attorney, Agent, or Firm* — Muncy, Geissler, Olds & Lowe, P.C.

(57) ABSTRACT

A lens driving device is provided, including a base, a holder, a first driving mechanism disposed on the first side of the base, a second driving mechanism disposed on the second side of the base opposite the first side, and a conductive member disposed on the base. The holder is configured to sustain a lens. The first driving mechanism is configured to force the holder to move along the optical axis of the lens. The second driving mechanism includes a circuit board assembly and a shape memory alloy (SMA) wire assembly configured to force the base to move in the plane perpendicular to the optical axis. The conductive member and the circuit board assembly are connected at an electrical connection point, and the SMA wire assembly is closer to the light-incident end of the lens with respect to the electrical connection point.

19 Claims, 14 Drawing Sheets

Related U.S. Application Data

(60) Provisional application No. 62/368,843, filed on Jul. 29, 2016.

(51) Int. Cl.
*G03B 3/10* (2006.01)
*G03B 5/02* (2006.01)
*G03B 29/00* (2006.01)
*G02B 7/09* (2006.01)
*G03B 5/04* (2006.01)
*G03B 13/36* (2006.01)
*H05K 1/18* (2006.01)
*H05K 1/14* (2006.01)
*G02B 13/00* (2006.01)

(52) U.S. Cl.
CPC ............... G03B 5/02 (2013.01); G03B 5/04 (2013.01); G03B 13/36 (2013.01); G03B 29/00 (2013.01); H05K 1/181 (2013.01); *G02B 13/001* (2013.01); *G03B 2205/0007* (2013.01); *G03B 2205/0015* (2013.01); *G03B 2205/0076* (2013.01); *H05K 1/144* (2013.01); *H05K 2201/10121* (2013.01); *H05K 2201/10227* (2013.01)

(58) Field of Classification Search
CPC ........ G02B 7/04; G02B 27/64; G02B 27/642; G02B 27/644; G02B 27/646; G02B 27/648; H04N 5/23264; H04N 5/2253; H04N 5/2254
See application file for complete search history.

(56) References Cited

U.S. PATENT DOCUMENTS

| | | | |
|---|---|---|---|
| 2014/0139710 A1 | 5/2014 | Chen | |
| 2015/0261067 A1* | 9/2015 | Jung | G03B 13/36 348/208.1 |
| 2015/0370086 A1 | 12/2015 | Hamada et al. | |
| 2019/0011614 A1* | 1/2019 | Park | H04N 5/225 |

* cited by examiner

US 10,782,538 B2

LENS DRIVING DEVICE

CROSS REFERENCE TO RELATED APPLICATIONS

This application is a continuation of application Ser. No. 15/658,869, filed on Jul. 25, 2017, which claims the benefit of U.S. Provisional Patent Application No. 62/368,843, filed on Jul. 29, 2016, and China Patent Application No. 201710570216.5 filed on Jul. 13, 2017, the entirety of which are incorporated by reference herein.

BACKGROUND OF THE INVENTION

Field of the Invention

The application relates in general to a lens driving device, and in particular to a lens driving device provided with shape memory alloy (SMA) wires to force the lens to move.

Description of the Related Art

Thanks to ongoing technological development, recent electronic devices (such as tablet computers and smartphones) usually include a lens module capable of aiding in photography or recording video. Based on the increase in image quality requirements, the use of lens driving devices with optical image stabilization (OIS) functionality has become a trend.

FIG. 1 is a schematic view diagram of an optical image stabilization (OIS) mechanism 1000 of a conventional lens driving device. As shown in FIG. 1, the OIS mechanism 1000 mainly includes a support member 1001, a movable member 1002, and a plurality of shape memory alloy (SMA) wires 1003. The SMA wires 1003 are disposed between the support member 1001 and the movable member 1002, and are able to force and control the movable member 1002 to move relative to the support member 1001 by applying electric power to them. Thus, optical shaking compensation can be provided for a lens module (not shown) disposed on the OIS mechanism 1000.

However, in order to achieve the electrical connection between the OIS mechanism 1000 and the lens module, it is necessary to form a plurality of gooseneck members 1004 (which are formed on the movable member 1002 and extend toward the lens module), and the base of the lens module needs to retain spaces (recesses) for receiving the gooseneck members 1004, so that the overall size of the lens module is increased and the structural strength of the base is decreased (due to the recesses). In addition, the gooseneck members 1004 also need to be spaced a predetermined distance apart from the SMA wires 1003 in order to avoid a situation of short-circuit or jamming causing the SMA wires 1003 to come into contact with the gooseneck members 1004, so that the size of the OIS mechanism 1000 is increased. It is unfavorable to the miniaturization of the lens driving device.

BRIEF SUMMARY OF INVENTION

To address the deficiencies of conventional products, an embodiment of the invention provides a lens driving device, including a base, a holder, a first driving mechanism disposed on the first side of the base, a second driving mechanism disposed on the second side of the base opposite the first side, and a conductive member disposed on the base. The holder is configured to sustain a lens. The first driving mechanism is configured to force the holder to move along the optical axis of the lens. The second driving mechanism includes a circuit board assembly and a shape memory alloy (SMA) wire assembly electrically connected to the circuit board assembly. The SMA wire assembly is configured to force the base to move in a plane perpendicular to the optical axis of the lens. The conductive member is configured to electrically connect the first driving mechanism to the second driving mechanism. In addition, the conductive member and the circuit board assembly are connected at an electrical connection point, and the SMA wire assembly is closer to the light-incident end of the lens with respect to the electrical connection point.

In some embodiments, the base has a surface facing the second driving mechanism, and the surface is closer to the light-incident end of the lens with respect to the electrical connection point.

In some embodiments, the circuit board assembly includes a first circuit board and a second circuit board, the first circuit board is disposed between the second circuit board and the base and connected to the base, and the SMA wire assembly electrically connects the first circuit board and a second circuit board and configured to force the first circuit board to move relative to the second circuit board in a plane perpendicular to the optical axis, wherein the electrical connection point is formed by the conductive member and the first circuit board.

In some embodiments, the first circuit board includes a first substrate and a first wiring layer, the first wiring layer is disposed on the first substrate and formed with a wiring layer opening, and the lens driving device further comprises an electrical connection element configured to electrically connect the conductive member and the first wiring layer in the position of the wiring layer opening.

In some embodiments, the base has a polygonal structure, and the electrical connection element is disposed near a corner of the base.

In some embodiments, the first substrate is formed with a substrate opening exposing the wiring layer opening when viewed from an outer side of the lens driving device.

In some embodiments, the electrical connection element partially overlaps with the first substrate when viewed from a direction perpendicular to the optical axis of the lens.

In some embodiments, the conductive member has an extending portion passing through the wiring layer opening and the substrate opening.

In some embodiments, the electrical connection element is disposed on the surface of the first substrate that faces the outer side of the lens driving device.

In some embodiments, the second circuit board includes a second substrate and a second wiring layer, and the second wiring layer is disposed on the second substrate, electrically connects to the first wiring layer, and extends to the outside of the lens driving device.

In some embodiments, the first driving mechanism includes a coil and a first magnetic element in corresponding positions, the coil is disposed on the holder, the lens driving device further comprises an elastic element disposed between the holder and the base, and the coil is electrically connected to the conductive member via the elastic element.

In some embodiments, the lens driving device further comprises a second magnetic element and a magnetic field sensing assembly in corresponding positions, wherein the second magnetic element is disposed on the holder, and the magnetic field sensing assembly includes a third circuit board and a magnetic field sensing chip disposed on the third circuit board, wherein the coil is electrically connected to the third circuit board via the elastic element, and then electrically connected to the conductive member via the third circuit board.

In some embodiments, the lens driving device further comprises a plurality of conductive members respectively electrically connecting a plurality of conductive terminals of the third circuit board, and the conductive members are arranged around an opening of the base.

In some embodiments, the first substrate of the first circuit board has a positioning member extending toward the base, and a positioning recess corresponding to the positioning member is formed on the base.

The aforementioned and other features and advantages of the present invention will become more apparent from the following detailed description taken with the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
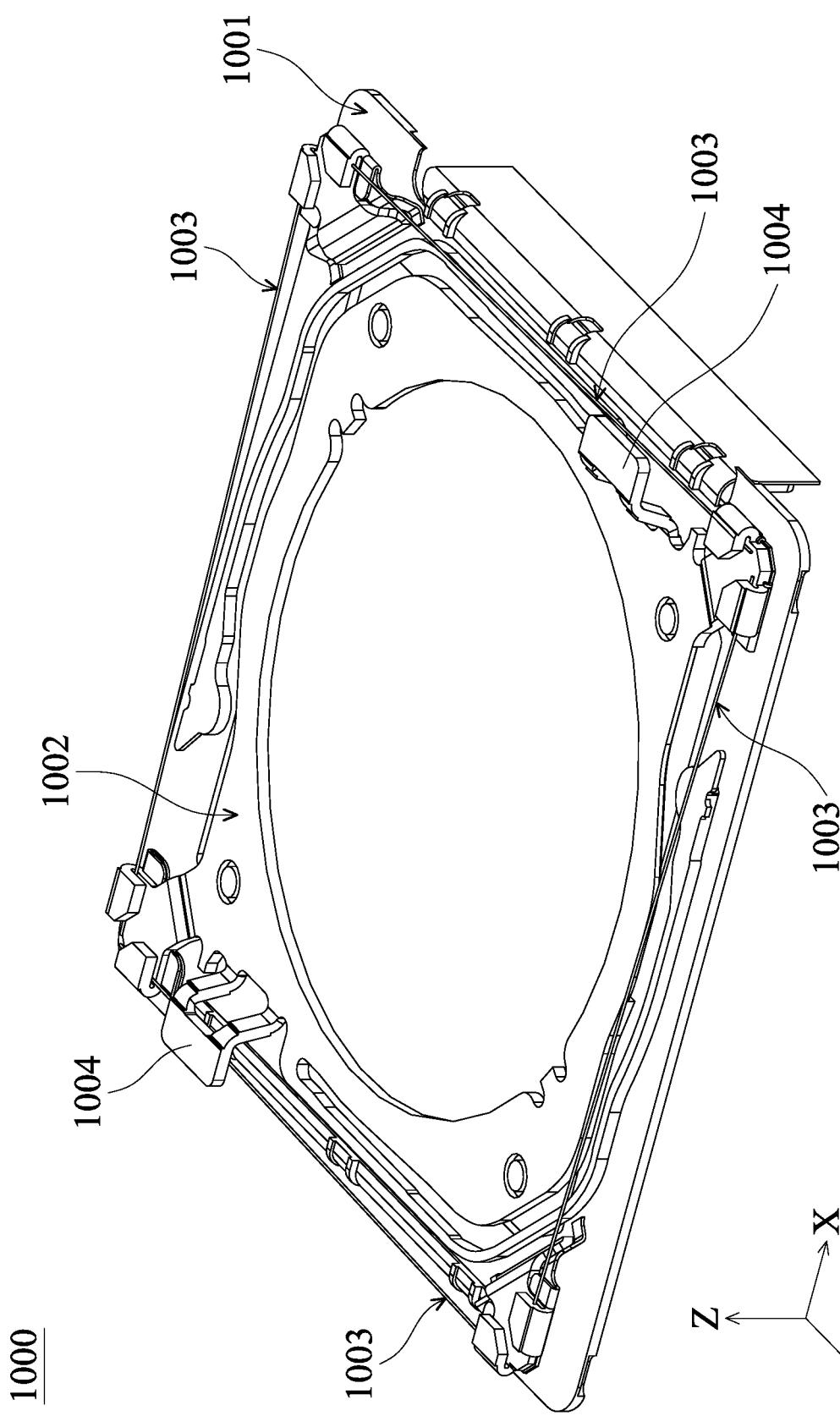
FIG. 1 is a schematic diagram of a conventional optical image stabilization (OIS) mechanism of a lens driving device.

The making and using of the embodiments of the lens driving device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following description, the term "upper" and "lower" are used only to indicate the relative positional relationship, and are not intended to limit the present invention. When it is stated that a first element is located on a second element, it may include cases where the first element is in direct contact with the second element or one or more other elements between them.

In addition, parts that are the same or similar use the same reference numerals in the drawings or the description. In the drawings, the shape or thickness of the embodiment may be enlarged for simplification, or otherwise conveniently indicated.

Figure 2:
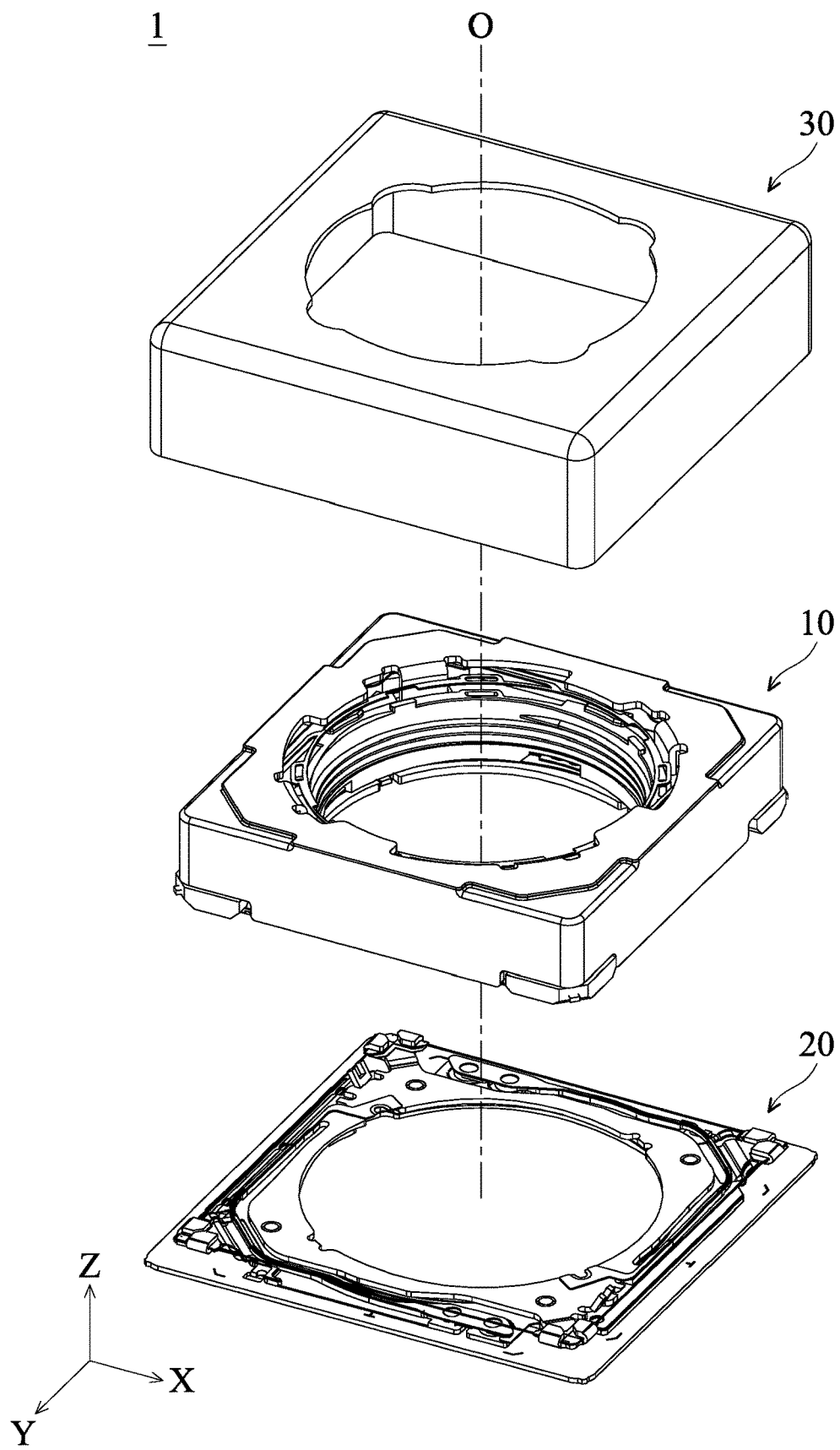
FIG. 2 is a partial exploded view diagram of a lens driving device according to an embodiment of the invention.

Please refer to FIG. 2, a lens driving device 1 according to some embodiments of the present invention is provided. The lens driving device 1, for example, may be disposed in a camera, a mobile phone, or a tablet computer, and comprises a lens module 10, an optical image stabilization (OIS) mechanism 20, and a housing 30 configured to receive the lens module 10 and the OIS mechanism 20. The lens module 10 is used to hold a lens (not shown) and forces the lens to move along its optical axis O (i.e., the Z-axis direction in the FIG. 2) relative to an image sensor (not shown) which is situated on the outside of the lens driving device 1, to achieve auto-focus (AF). The lens module 10 may be affixed to the OIS mechanism 20 by an adhesive means. The OIS mechanism 20 is configured to force the lens module 10 to move in a plane perpendicular to the optical axis O (i.e., the XY plane in the FIG. 2), to provide optical shaking compensation, thereby enhancing image quality.

It should be understood that one purpose of the present invention is to provide a lens driving device, in which the traditional gooseneck member for electrically connecting the lens module 10 and OIS 20 may be omitted, to achieve the effect of miniaturizing the lens driving device. The basic structure and driving principle of the OIS mechanism 20 according to some embodiments of the present invention are described below.

Figure 3:
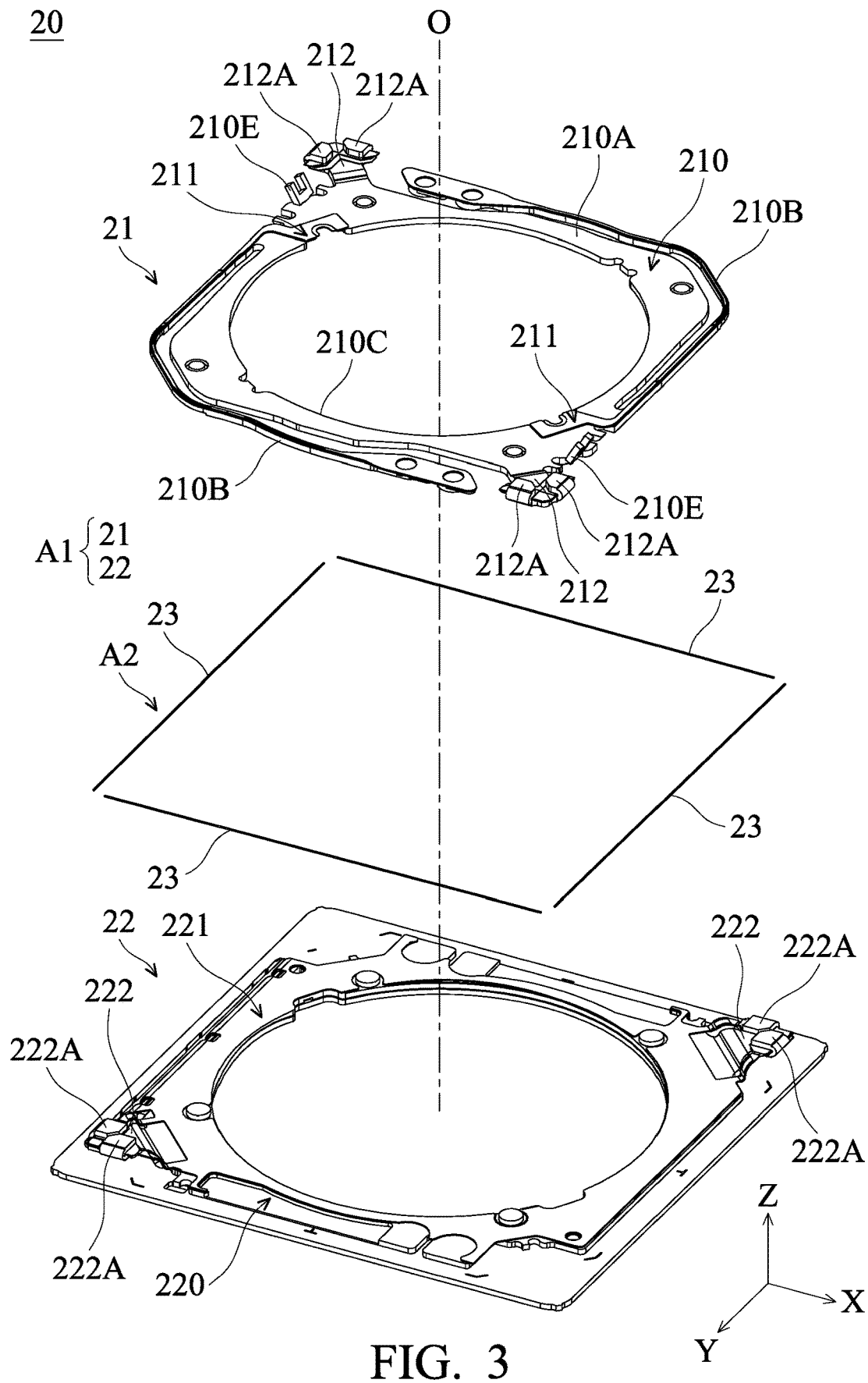
FIG. 3 is an exploded view diagram of the optical image stabilization (OIS) mechanism in FIG. 2.
Figure 4:
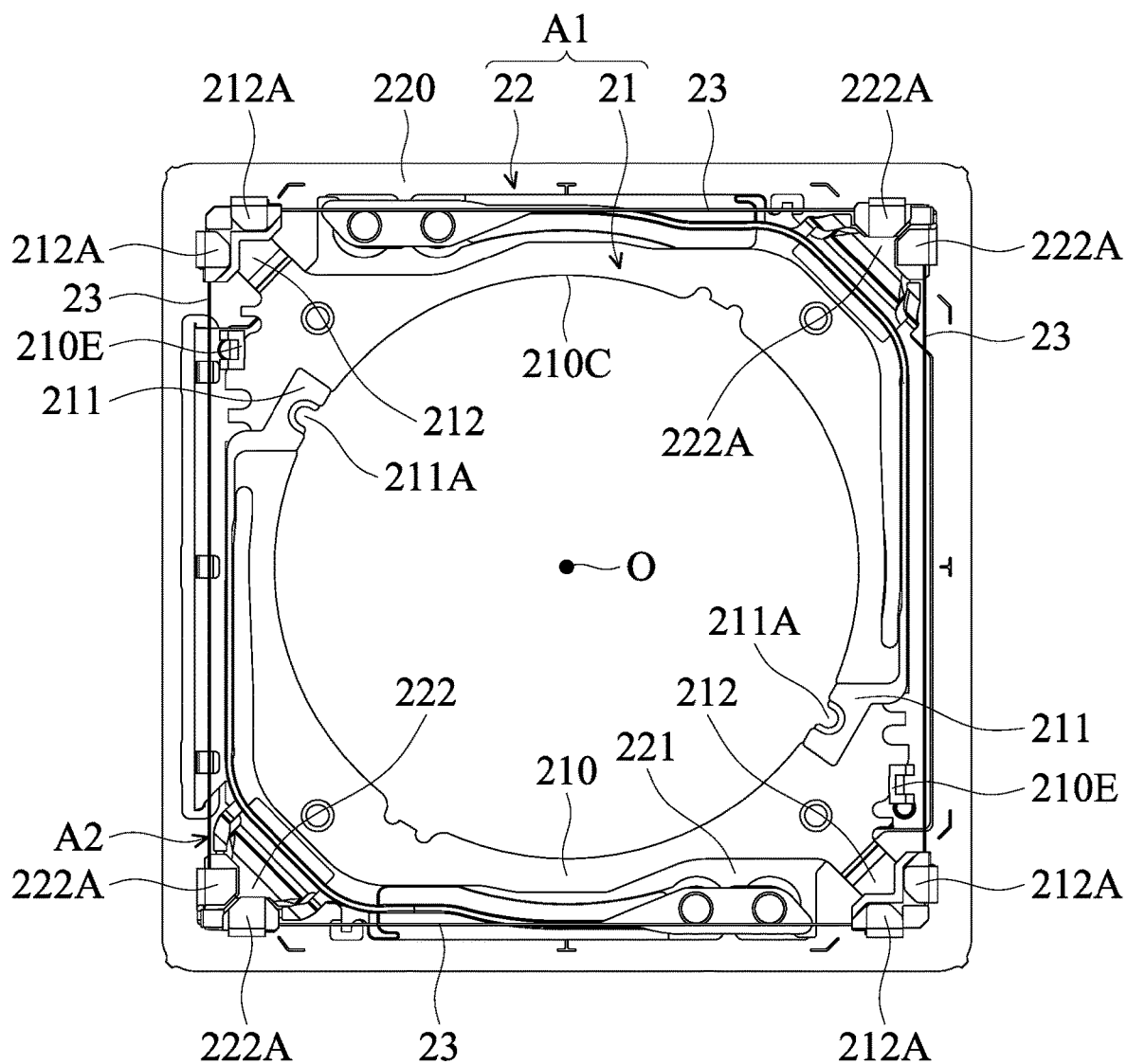
FIG. 4 is a top plan view diagram of the OIS mechanism in FIG. 3 after assembly.
Figure 4:
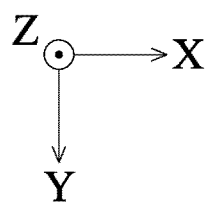

As shown in FIGS. 3 and 4, the OIS mechanism 20 primarily includes a circuit board assembly A1 and a shape memory alloy (SMA) wire assembly A2. The circuit board assembly A1 includes a first circuit board 21 and a second circuit board 22 stacked vertically. The SMA wire assembly A2 includes a plurality of (e.g., four) SMA wires 23 which may comprise titanium-nickel (Ti—Ni) alloy, titanium-palladium (Ti—Pd) alloy, titanium-nickel-copper (Ti—Ni—Cu) Alloy, titanium-nickel palladium (Ti—Ni—Pd) alloy or a combination thereof. The SMA wires 23 electrically connect the first circuit board 21 to the second circuit board 22 and their lengths are able to change by applying a drive signal (e.g., current) from an external power source (not shown). For example, when one SMA wire 23 is heated by applying a drive signal, the SMA wire 23 may be elongated or shortened. When the application of the drive signal is stopped, the SMA wire 23 may be restored to its original length.

In this way, the lengths of the SMA wires 23 of the SMA wire assembly A2 can be controlled by applying appropriate drive signals to force the first circuit board 21 (a movable member) to move with respect to the second circuit board 22 (a support member) Furthermore, as the first circuit board 21 moves, the lens module 10 (FIG. 2) connected to the first circuit board 21 may also be moved relative to the second circuit board 22, so that the lens driving device 1 has the function of optical image stabilization and optical shaking compensation.

Continuing refer to FIGS. 3 and 4; the first circuit board 21 includes a first substrate 210 and a first wiring layer 211. The first substrate 210 may have a metallic material (e.g., stainless steel) and includes a substantially rectangular main body portion 210A and a plurality (e.g., two) L-shaped arm portions 210B extending from the main body portion 210A, wherein the arm portion 210B are arranged to correspond to the four sides of the main body portion 210A. The first wiring layer 211 is formed on the arm portions 210B of the first substrate 210 and extends partially to the main body portion 210A. For the purpose of electrical isolation, the first wiring layer 211 is covered with an insulating layer. In some embodiments, the first wiring layer 211 may be formed on the first substrate 210 in a manner such as insert molding or 3D molded interconnect device technology.

Furthermore, a plurality of (e.g., two) protrusions 212 with stepped-shape are formed on a diagonal line of the first substrate 210, and each of the protrusions 212 has a plurality of (for example, two) wiring connecting structures 212A. The first wiring layer 211 may extend to the protrusions 212 to electrically connect the wiring connecting structures 212A.

Similarly, the second circuit board 22 includes a second substrate 220 and a second wiring layer 221. The second substrate 220 may have a metallic material (e.g., stainless steel) and be substantially rectangular. The second wiring layer 221 substantially covers the upper surface of the second substrate 220. For the purpose of electrical isolation, an insulating layer (not shown) may be covered the second wiring layer 221. The second wiring layer 221 may also be formed on the second substrate 220 by insert molding or 3D molded interconnect device technology.

Moreover, a plurality of (e.g., two) protrusions 222 with stepped-shape are formed on a diagonal line of the second substrate 220, and each of the protrusions 222 has a plurality of (for example, two) wiring fixing structures 222A. The second wiring layer 221 may extend to the protrusions 222 of the second substrate 220 to electrically connect the wiring fixing structures 222A.

As shown in FIG. 4, after the OIS mechanism 20 is assembled, the wiring connecting structure 212A of the first circuit board 21 and the wiring fixing structure 222A of the second circuit board 22 are located at the four corners of the OIS mechanism 20, and one wiring connecting structure 212A and one wiring fixing structure 222A are visible on each side of the OIS mechanism 20, wherein each of the SMA wires 23 electrically connects the wiring connecting structure 212A and the wiring fixing structure 222A. In addition, the first wiring layer 211 of the first circuit board 21 can be electrically connected to the second wiring layer 221 of the second circuit board 22, for example, by welding. Although not shown, the second wiring layer 221 may extend to the outside of the OIS mechanism 20 to electrically connect to an external power source.

With the arrangement of the OIS mechanism 20 (second drive mechanism) as described above, when the appropriate driving signals are applied to the SMA wires 23 of the SMA wire assembly A2, the shapes of SMA wires 23 are changed (such as elongation or shortening) so that the first circuit board 21 and the lens module 10 (FIG. 2) connected thereto can be moved with respect to the second circuit board 22 in a plane (XY plane) perpendicular to the optical axis O (including linear moving along the direction perpendicular to the optical axis O relative to the second circuit board 22; or rotating around the optical axis O relative to the second circuit board 22), to provide optical shaking compensation.

Next, the structure of the lens module 10 and its electrical connection relationship with the OIS mechanism 20 will be described.

Figure 5:
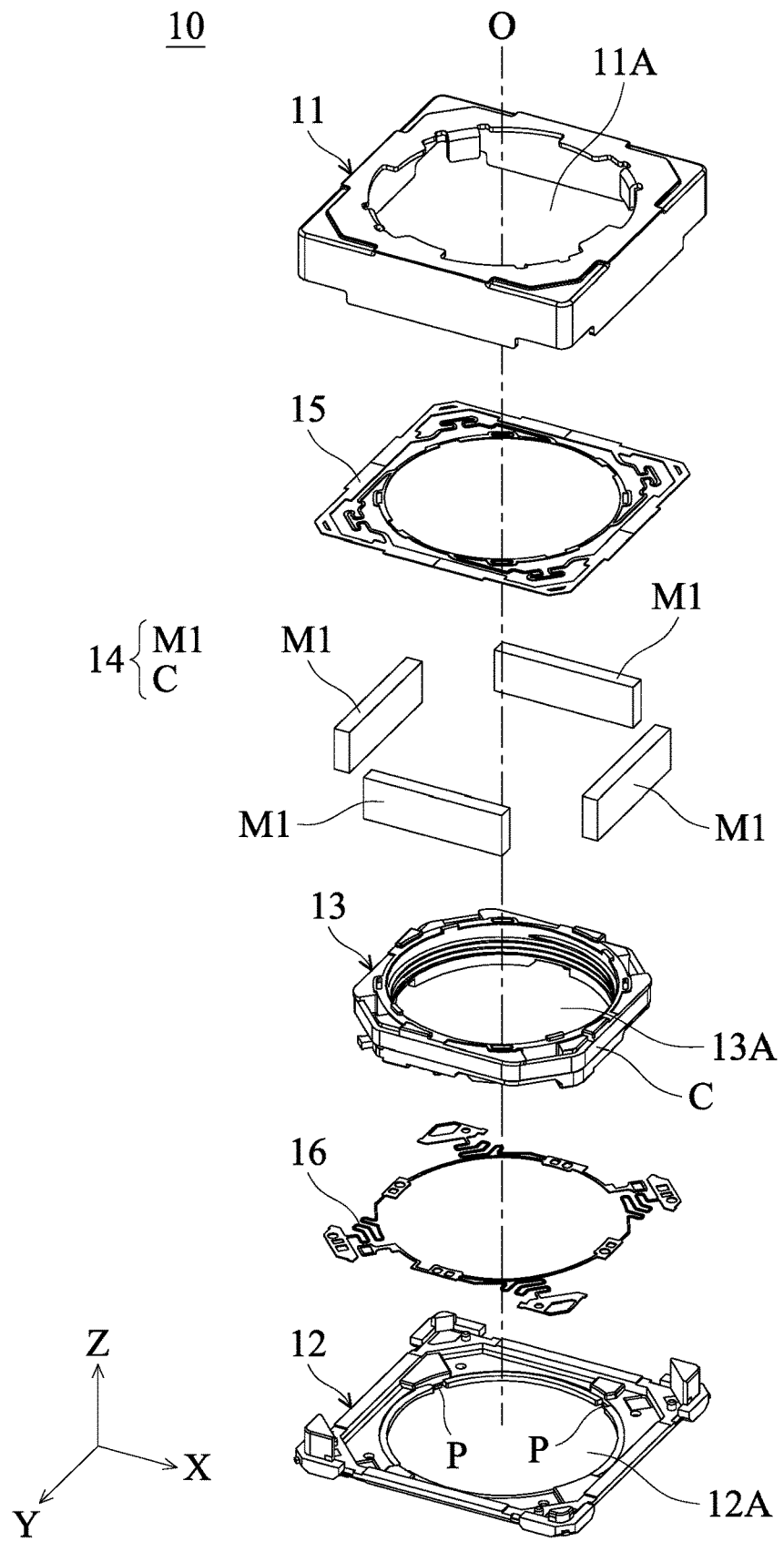
FIG. 5 is an exploded view diagram of the lens module in FIG. 2.
Figure 6:
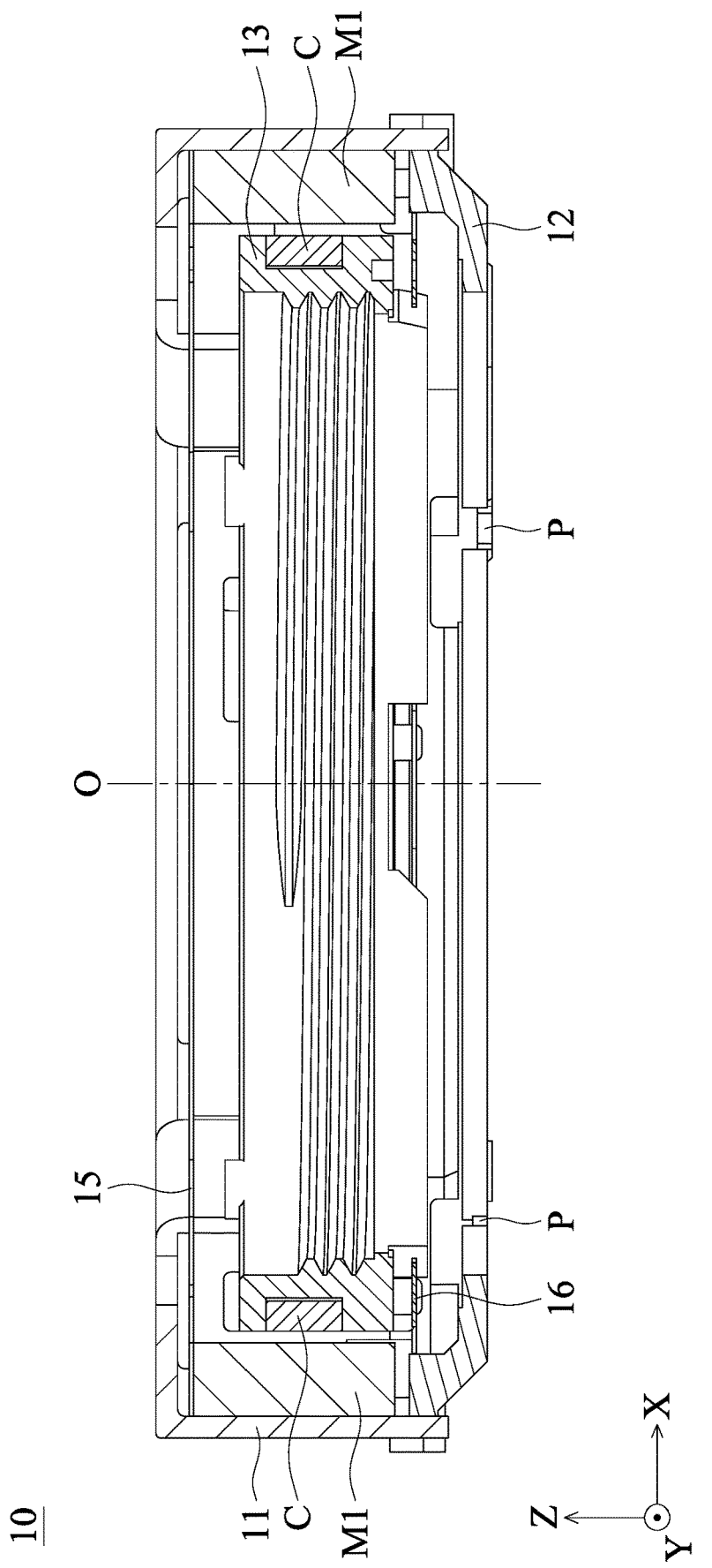
FIG. 6 is a sectional view diagram of the lens module in FIG. 5 after assembly.

As shown in FIGS. 5 and 6, the lens module 10 includes a frame 11, a base 12, a holder 13, an electromagnetic driving mechanism 14, and a plurality of elastic elements 15 and 16.

The frame 11 and the base 12 may be combined with each other where the aforementioned components or elements may be received. A lens (not shown) of the lens module 10 can be used to capture light from the outside through a frame opening 11A formed on the frame 11. The base 12 is formed with a base opening 12A, wherein the base opening 12A and the frame opening 11A are located on the optical axis O of the lens. Whereby the lens in the lens module 10 can be focused on the optical axis O with an image sensor (not shown) situated on the outside of the lens driving device 1 (for example, the upper and lower sides thereof), to perform photography.

The holder 13, disposed on the upper side (first side) of the base, has a through hole 13A configured to receive the lens. The through hole 13A and the lens may have thread structures (not shown) corresponding to each other to firmly dispose the lens in the through hole 13A.

The electromagnetic drive mechanism 14 (first drive mechanism) includes a coil C and a plurality of (e.g., four) first magnetic elements M1 (e.g., magnets). The coil C is wound around the outer surface of the holder 13. In some embodiments, the coil C may be quadrilateral, hexagonal, octagonal, or other optional shape conforming to the shape of the holder 13. The elongated first magnetic elements M1 are respectively disposed on different inner sidewalls of the frame 11 and correspond to the coil C. In some embodiments, the first magnetic elements M1 may also be triangular and respectively disposed at a corner between the two inner sidewalls of the frame 11.

Furthermore, the holder 13 and the lens therein are disposed between the elastic elements 15 and 16 made of an elastic material (for example, metal leaf springs) and are elastically suspended in the center of the frame 11. More specifically, the top of the holder 13 may be connected to the elastic element 15, and the elastic element 15 is connected to the inner sidewall of the frame 11; and the bottom of the holder 13 may be connected to the elastic element 16, and the elastic element 16 is connected to the inner sidewall of the base 12.

In this way, when an external power source (not shown) applies a driving signal (e.g., current) to the coil C, an electromagnetic force is generated by the magnetic field of the coil C and the first magnetic element M1 to force the holder 13 and the lens to move relative to the frame 11 along the optical axis O (Z-axis direction) of the lens, thereby achieving the auto-focus function. Furthermore, the elastic elements 15 and 16 can provide a cushioning effect in the direction of the optical axis O to avoid the carrier 13 and the lens being damage.

When the lens module 10 is already assembled and connected to the OIS mechanism 20 (refer also to FIGS. 2-6 and 9), the OIS mechanism 20 is situated at the lower side (the second side) of the base 12 of the lens module 10, and the first circuit board 21 of the OIS mechanism 20 is situated between the base 12 and the second circuit board 22 and connects to the base 12.

Figure 7:
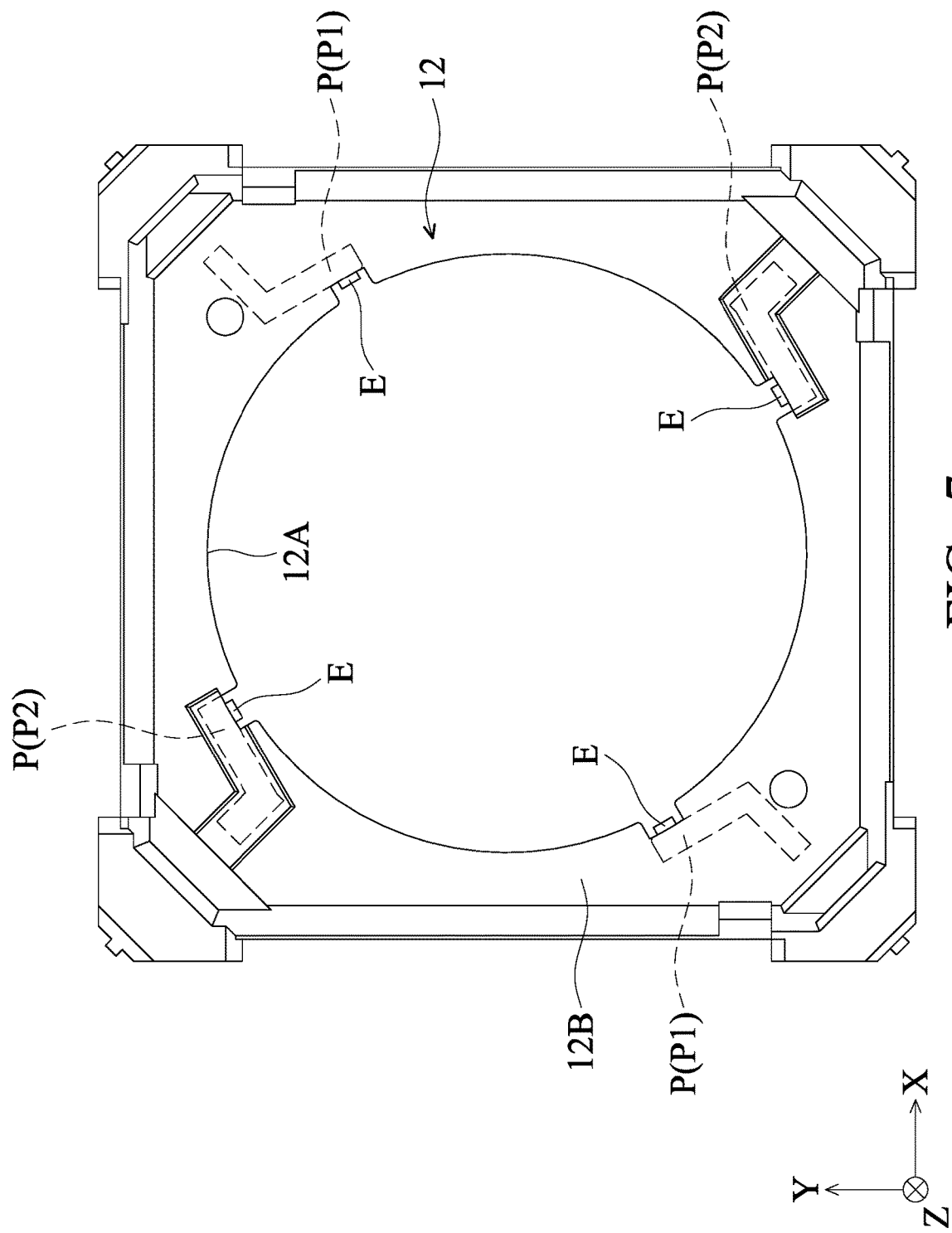
FIG. 7 is a bottom plan view diagram of the base of the lens module in FIG. 5.

Furthermore, the coil C of the electromagnetic drive mechanism 14 of the lens module 10 may be electrically connected to an external power source (not shown) via the elastic member 16 and a plurality of conductive members P disposed on the base 12. Specifically, the two ends of the coil C may be electrically connected to the plurality of conductive members P on the base 12 via a plurality of (e.g., two) independent portions of the elastic member 16, respectively. According to some embodiments (e.g., with reference to FIG. 7), the base 12 may have a plurality of (e.g., four) conductive members P, wherein the two conductive members P1 are electrically connected to a plurality of independent portions of the elastic element 16, and the other two conductive members P2 are not electrically connected to the elastic member 16. The conductive members P may have a metallic material (e.g., copper) and be embedded in the base 12 by insert molding or 3D molded interconnect device technology.

In some embodiments, the conductive members P may have a long plate-like plate structure (but not limited) and are arranged to surround the base opening 12A of the base 12. In addition, the surfaces of the conductive members P are adjacent to the bottom surface 12B of the base 12, and only the end portion E of each conductive member P which extends toward the base opening 12A (in its radial direction) is exposed to the outside of the base 12, configured to connect the first circuit board 21 of the OIS mechanism 20.

Figure 8:
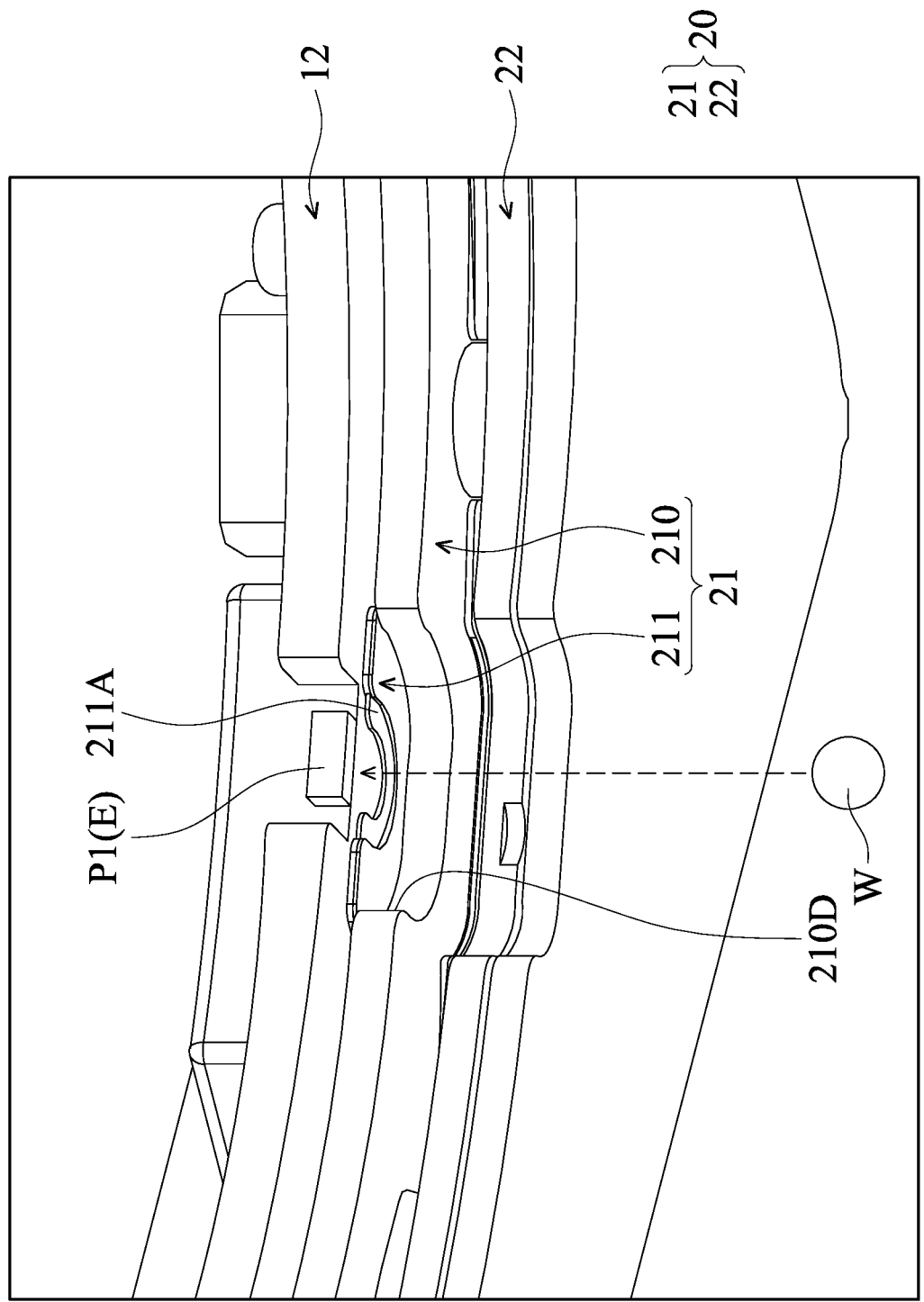
FIG. 8 is a schematic diagram of the position relationship of the conductive member on the base and the OIS mechanism in FIG. 5 when viewed from the lower side of the lens driving device.
Figure 9:
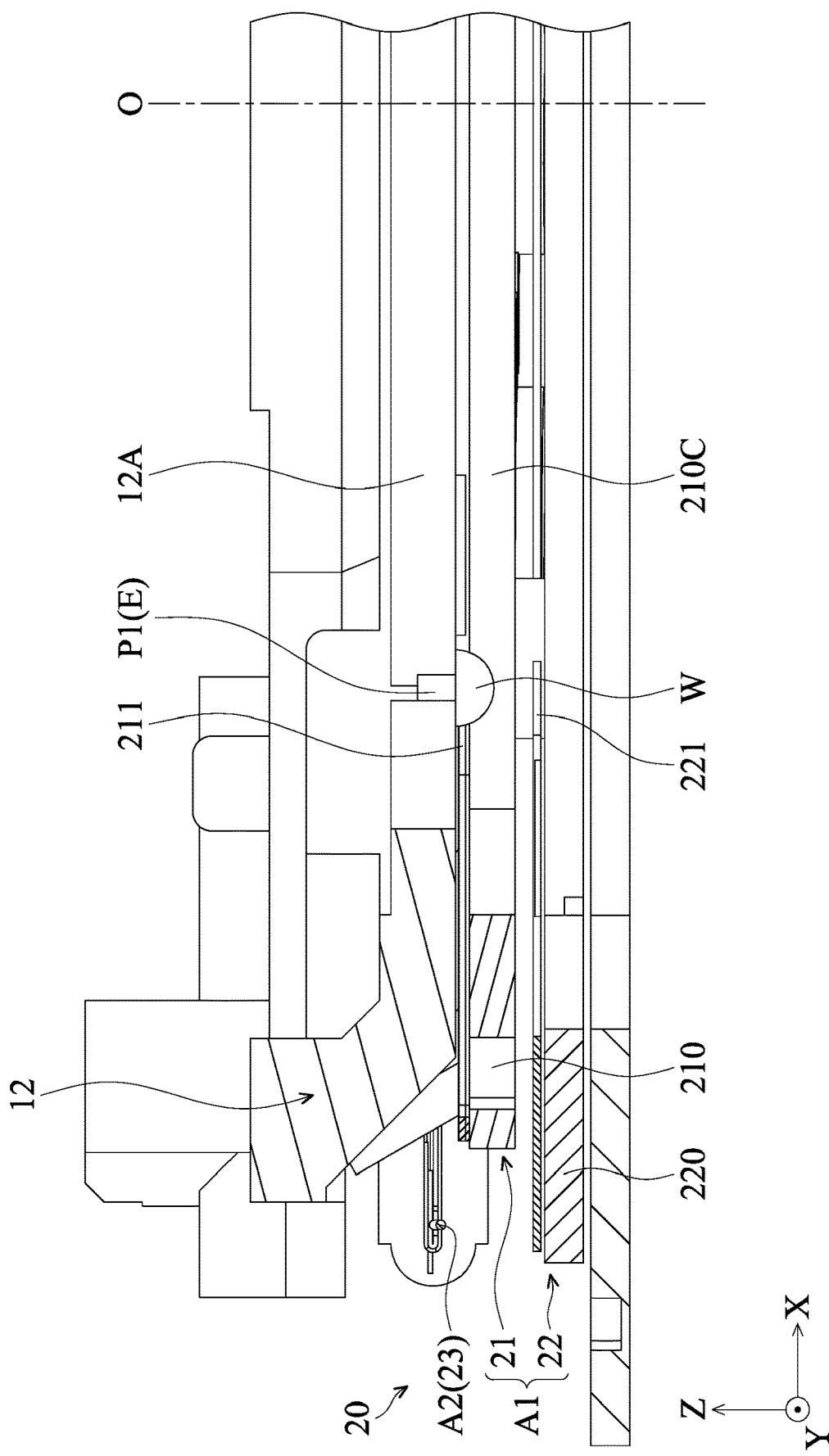
FIG. 9 is a schematic diagram of the position relationship of the conductive member on the base and the OIS mechanism in FIG. 5 when viewed from a direction of optical axis of the lens.

Referring to FIGS. 4, 7, 8 and 9, at the position adjacent to an opening portion 210C in the center of the first substrate 210, the first wiring layer 211 disposed on the first circuit board 21 of the OIS mechanism 20 may formed with a plurality of wiring layer openings 211A to expose the wires therein, and the position of each wiring layer opening 211A corresponds to the position of each end portion E of the conductive member P1 on the base 12 of the lens module 10 (FIGS. 8 and 9). The end portion E of the conductive member P1 and the exposed wires in the wiring layer opening 211A of the first wiring layer 211 may be connected at an electrical connection point.

In addition, when viewed from an outer side of the lens driving device 1 (for example, from the lower side of the OIS mechanism 20), a plurality of (for example, two) substrate openings 210D are formed on the first substrate 210 (FIG. 8) and correspondingly exposes the wiring layer openings 211A of the first wiring layer 211. The substrate opening 210D may allow an electrical connection element W (e.g., solder) to be applied from the lower side of the OIS mechanism 20 to the position of the wiring layer opening 211A, to electrically connect the end portion E of the conductive member P1 and the first wiring layer 211. Furthermore, the wiring layer opening 211A may facilitate the coupling of the electrical connection element W with the first wiring layer 211. It is to be noted that the electrical connection element W partially overlaps the first substrate 210 when viewed from a direction perpendicular to the optical axis O of the lens (as shown in FIG. 9).

It should be noted that the conductive member P2, which is not electrically connected to the elastic member 16 on the base 12, may be welded to the first circuit board 21 by the electrical connection element W (e.g., solder), so that the bonding strength between the lens module 10 and the OIS mechanism 20 is improved.

With the above design, the electrical connection between the electromagnetic drive mechanism 14 (first driving mechanism) of the lens module 10 and the OIS mechanism 20 (second driving mechanism) can be achieved, and the lens driving device 1 has the functions of auto-focus and optical image stabilization.

It should be understood that the lens driving device 1 of the above embodiment omits the gooseneck member of the conventional technique for electrically connecting the lens module 10 and the OIS mechanism 20, so that the lens driving device 1 can be miniaturized. More specifically, since it is not necessary to provide a gooseneck member extending toward the base 12 of the lens module 10 on the OIS mechanism 20 so that the base 12 does not have to retain a space (or recess) for receiving the gooseneck member. Thus the size of the lens module 10 can be decreased. Moreover, since the structural integrity of the base 12 can be maintained, the structural strength may also be increased.

It should be noted that the conductive member P1 and the first circuit board 21 of the circuit board assembly A1 are connected at an electrical connection point (the position where the end portion E of the conductive member P1 is in contact with the electrical connection element W; see FIG. 9) when viewed from a direction perpendicular to the optical axis O of the lens (as shown in FIG. 9). The SMA wire assembly A2 is closer to the light-incident end (i.e., the upper side of the lens driving device 1) of the lens with respect to the electrical connection point, and a surface of the base 12 which faces the OIS mechanism 20 is also closer to the light-incident end of the lens with respect to the electrical connection point. Furthermore, the electrical connection point is located at a position which is adjacent (near or close) to the opening portion 210C (or the base opening 12A of the base 12) in the center of the first circuit board 21; and away from the SMA wire assembly A2 (located on the outer side of the first circuit board 21 and the base 12), so that it is possible to avoid the risk of short-circuiting caused by the contact of the electrical connection point and the SMA wire assembly A2.

Figure 10:
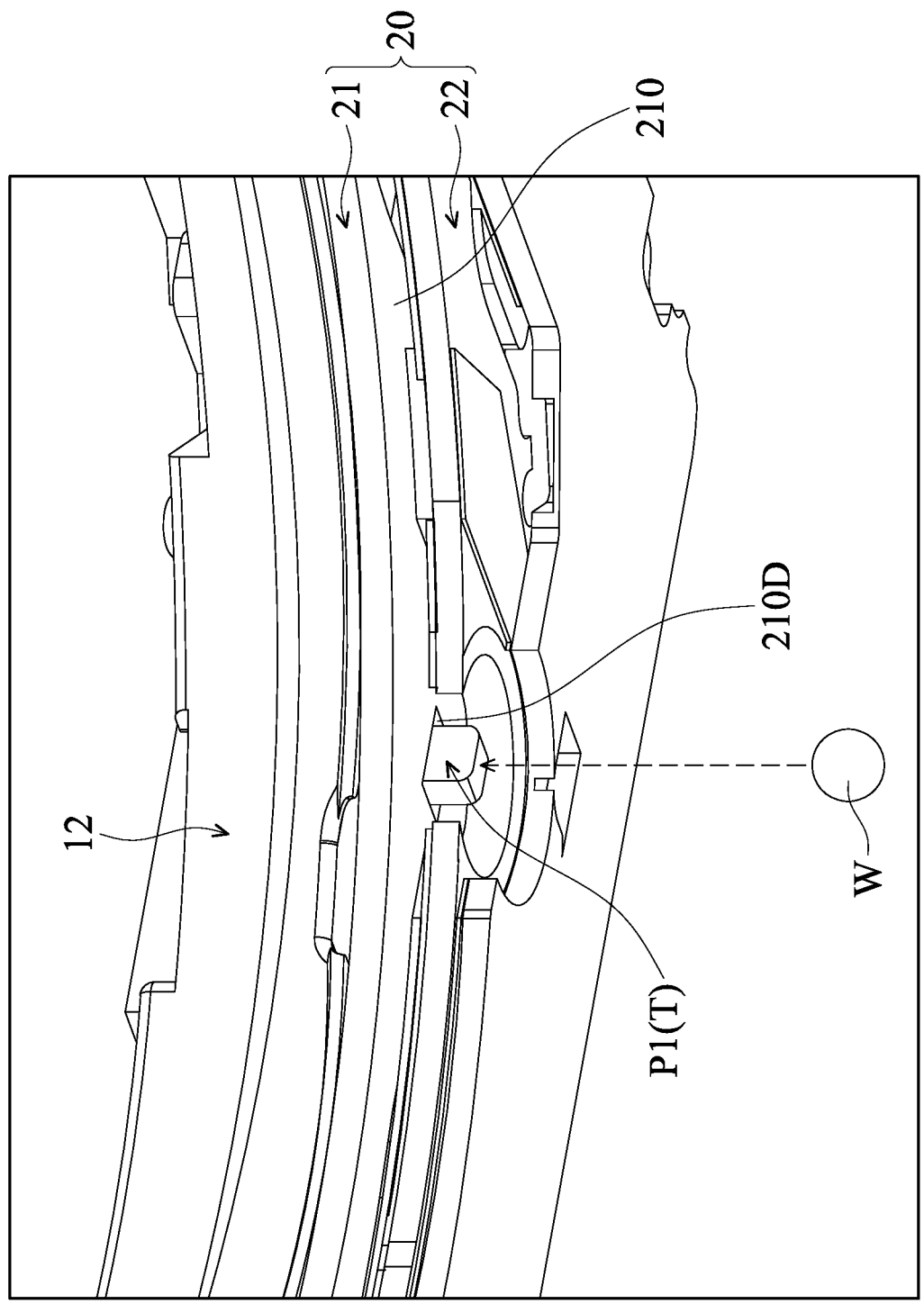
FIG. 10 is a schematic diagram of the position relationship of a conductive member on a base and an OIS mechanism when viewed from the lower side of the lens driving device according to another embodiment of the invention.

In some embodiments (FIG. 10), the conductive member P1 on the base 12 may be formed with an extending portion T extending toward the first circuit board 21 of the circuit board assembly A1 and passing through the wiring layer opening 211A of the first wiring layer 211 of the circuit board 21 (the first wiring layer 211 and the wiring layer opening 211A are not visible in FIG. 10 due to the viewing angle) and the substrate opening 210D. The substrate opening 210D may allow an electrical connection element W (e.g., solder) to be applied from the lower side of the OIS mechanism 20 to the position of the wiring layer opening 211A (in this case, the electrical connection element W is disposed on the lower surface of the first circuit board 21 facing the lens driving device 1) to electrically connect the conductive member P1 and the first wiring layer 211. In the preferred case, the electrical connection element W may be coated over the extending portion T (which passes through the first substrate 21) to avoid exposure to the outside. By this design, it is possible to increase the bonding area between the electrical connection element W and the conductive member P1 and to improve the reliability of the assembling process.

In some embodiments, the electrical connection element W may also be disposed proximate the corner of the base 12 (having a polygonal structure) and spaced from the opening portion 210C of the first substrate 210 (so that the electrical connection point formed by the conductive member P1 and the first circuit board 21 of the circuit board assembly A1 also needs to be moved correspondingly). This configuration prevents the lens from being disturbed.

Figure 11:
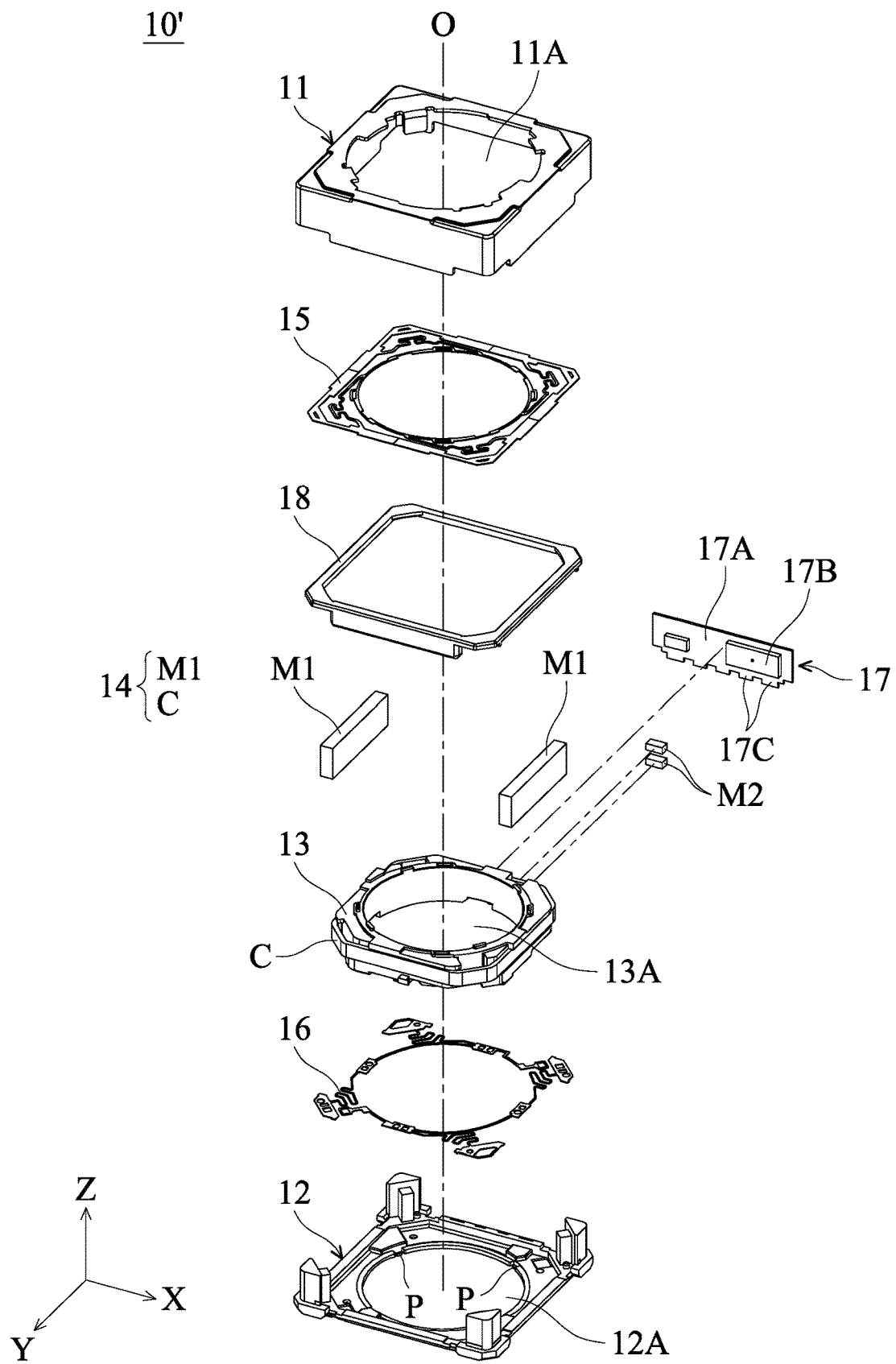
FIG. 11 is an exploded view diagram of a lens module according to another embodiment of the invention.
Figure 12:
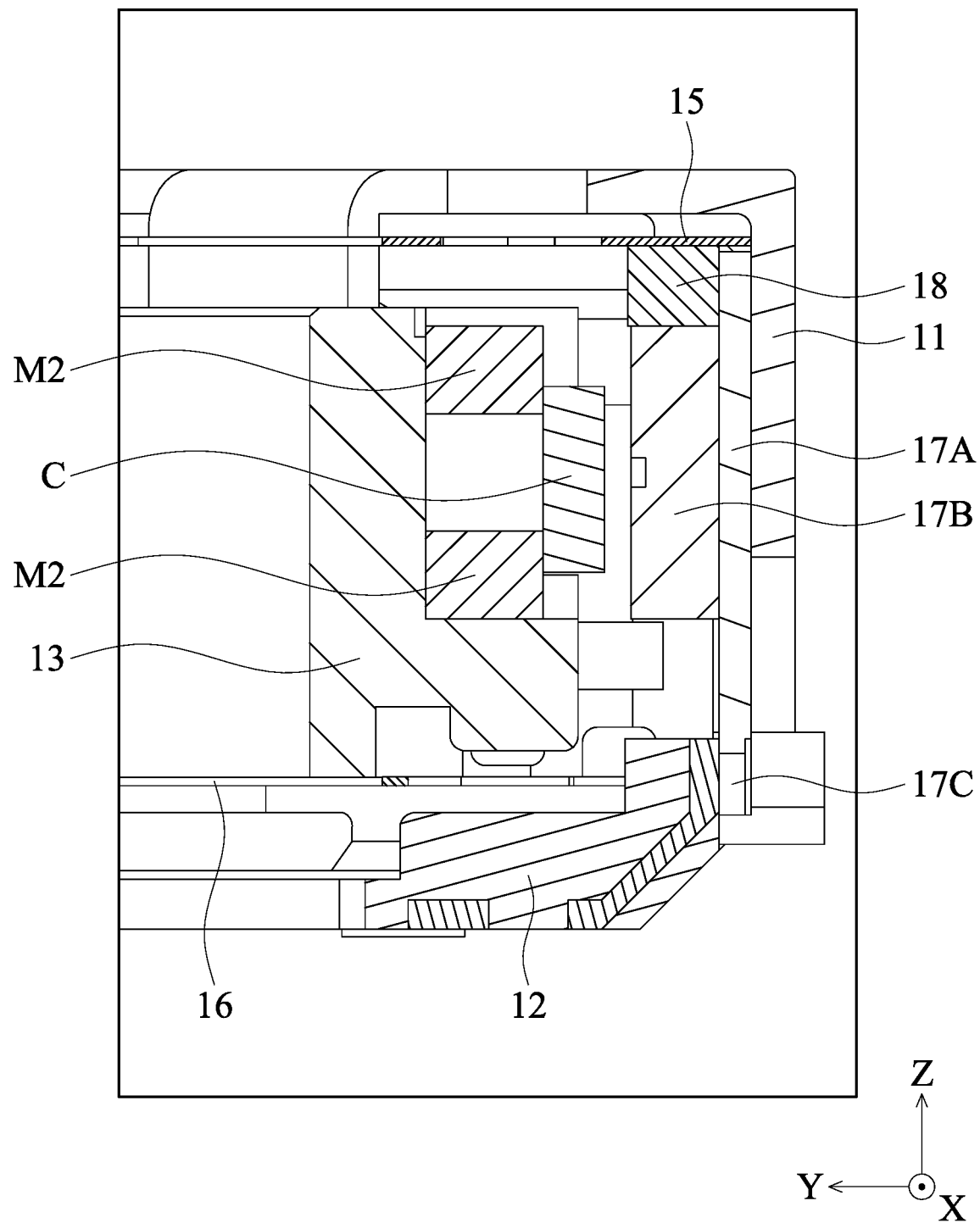
FIG. 12 is a partial sectional view diagram of the lens module in FIG. 11 after assembly.

FIG. 11 shows an exploded view of the lens module 10' according to another embodiment of the present invention, and FIG. 12 is a partial sectional view of the lens module 10' in FIG. 11 after assembly. As shown in FIGS. 11 and 12, the main difference between the lens module 10' and the lens module 10 of the aforementioned embodiment (FIGS. 5-7) is that the lens module 10' further includes a plurality of (e.g., two) second magnetic elements M2 (e.g., magnets) and a magnetic field sensing assembly 17. The second magnetic element M2 is disposed on the outer surface of the holder 13. It should be understood that the sensing accuracy may be increased by using a plurality of second magnetic elements M2, and using a magnetic element having a plurality of magnetic poles (e.g., four magnetic poles) instead of a plurality of second magnetic elements M2 may achieve similar effects. A cover plate 18 may also be provided in the frame 11 to position the first magnetic elements M1, thereby improving the positioning accuracy. The magnetic field sensing assembly 17 is provided on an inner side wall of the frame 11 and corresponds to the second magnetic elements M2, wherein the magnetic field sensing assembly 17 includes a circuit board 17A (third circuit board; e.g., a flexible circuit board) and a magnetic field sensing chip 17B disposed on the circuit board 17A.

The position of the holder 13 and the lens in the optical axis O may be informed by the magnetic field sensing chip 17B sensing the magnetic field changing caused by the moving of the second magnetic elements M2. Furthermore, the magnetic field sensing assembly 17 may be electrically connected to an external power source (not shown) which may apply another driving signal (e.g., current) to the coil C disposed on the holder 13 based on the position of the holder 13 as detected by the magnetic field sensing chip 17B (in some embodiments, the magnetic field sensing chip 17B may also have a function of controlling the amount of the driving signal provided to the coil C), and then the electromagnetic driving force generated by the magnetic field driving mechanism 14 make the holder 13 and the lens move to the desired position along the optical axis O (Z-axis direction) of the lens. In this way, a closed-loop auto-focusing control can be realized.

Figure 13:
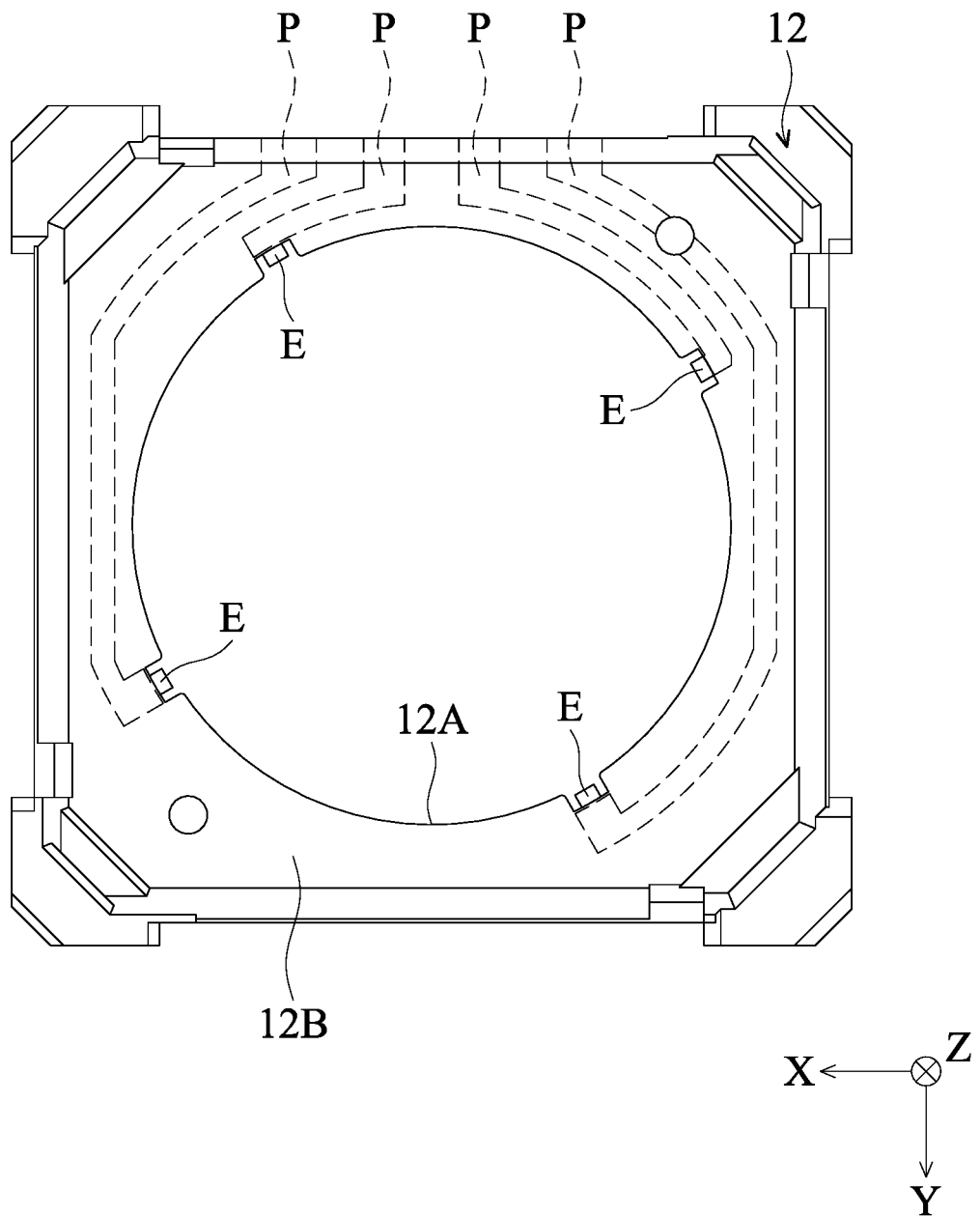
FIG. 13 is a bottom plan view diagram of the base of the lens module in FIG. 11.

According to some embodiments, the coil C may electrically connect the circuit board 17A of the magnetic field sensing assembly 17 via the resilient element 16, and then electrically connect the a plurality of (e.g., four) conductive members P of the base 12 via the conductive terminals 17C (FIG. 11) of the circuit board 17A. As shown in FIG. 13, the conductive members P may have a long plate-like plate structure (but not limited) and are disposed around the base opening 12A of the base 12. Specifically, one end of each conductive member P is disposed on a side of the base 12 connected to the conductive terminal 17C of the circuit board 17A, and the other end is disposed around the base opening 12A of the base 12. Furthermore, the surface of the conductive member P is adjacent to the bottom surface 12B of the base 12, and the conductive member P is exposed to the outside of the base 12 only at the end portion E thereof extending toward the base opening 12A (in its radial direction), configured to connect the first circuit board 21 of the OIS mechanism 20.

The electrical connection between the conductive members P and the first circuit board 21 of the OIS mechanism 20 and its advantages are the same as those of the foregoing embodiments, and the repetitive description is omitted here.

Figure 14:
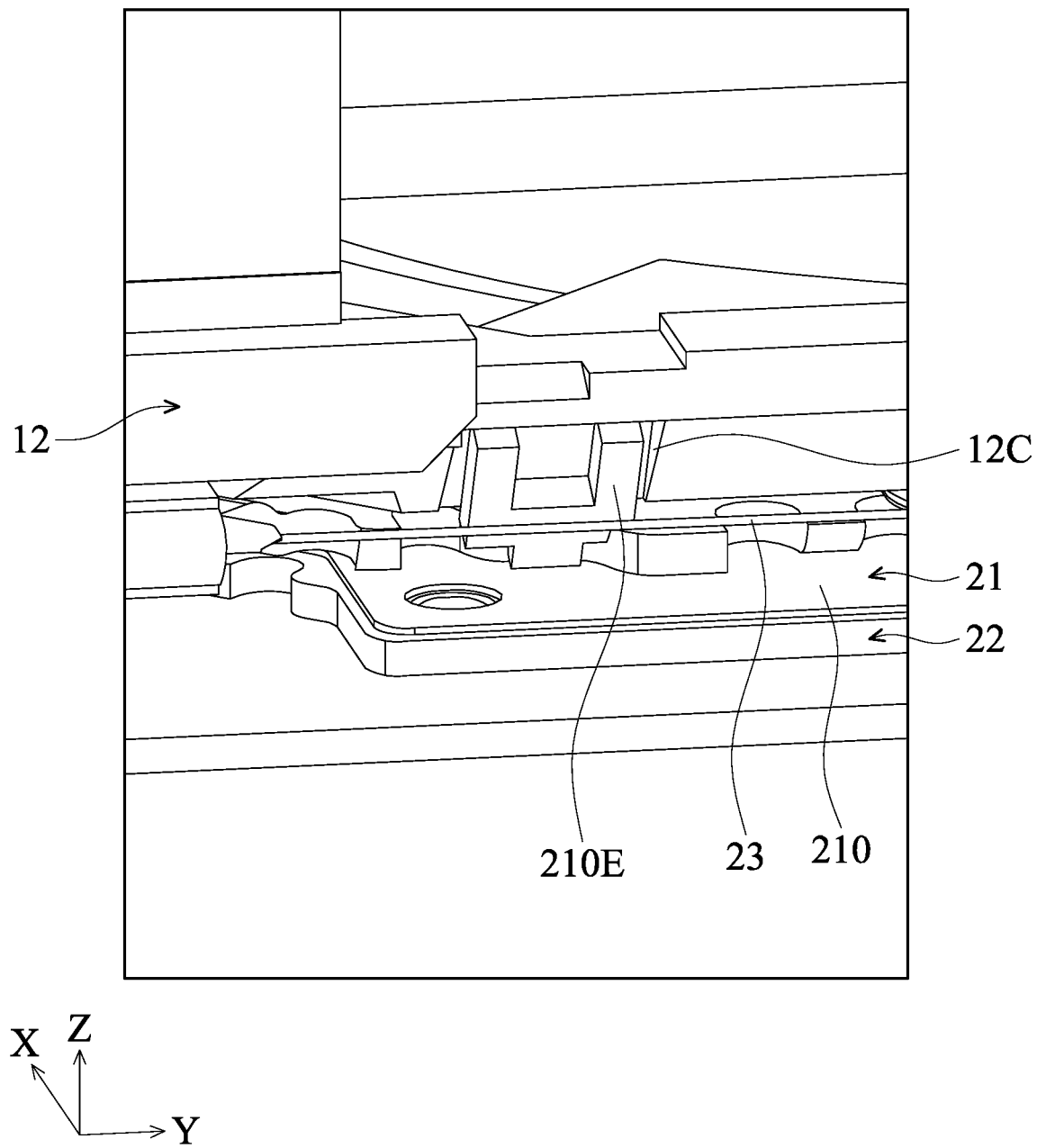
FIG. 14 is a schematic diagram of the position relationship of a positioning recess on a base and a first circuit board of an OIS mechanism according to another embodiment of the invention.

In addition, according to some embodiments (please refer to FIGS. 3, 4, and 14), the first substrate 210 of the first circuit board 21 of the OIS mechanism 20 may also have at least one positioning member 210E, which extends toward the base 12 of the lens module 10, and at least one positioning recess 12C may be formed on the base 12 (for example, formed on the bottom of the outer sidewall of the base 12) corresponding to the position member 210E. Thus, the positioning between the lens module 10 and the OIS mechanism 20 can be facilitated, and an adhesive may be applied between the positioning member 210E and the positioning recess 12C to assist the assembling work.

In summary, a lens driving device is provided, in which the gooseneck member for electrically connecting the lens module and the OIS mechanism in the conventional technique can be omitted, and the conductive member embedded in the base of the lens module is directly electrically connected to the OIS mechanism, so as to achieve structural simplification and miniaturization of lens driving device. In addition, since the conductive member of the base is not exposed to the outside, the situation of short-circuit due to the influence by other components (such as SMA wires) may be avoided or decreased.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A lens driving device, comprising:
 a holder, configured to sustain a lens element having an optical axis;
 a base, wherein the holder is movable relative to the base;
 a base conductive assembly, having a plurality of conductive members disposed on a plane surface that is perpendicular to the optical axis;
 a drive mechanism, configured to drive the holder to move relative to the base;
 a position sensing assembly, configured to sense the holder to move relative to the base, wherein the position sensing assembly has a position sensing element and a circuit board, wherein the position sensing element is electrically connected to the base conductive assembly via the circuit board, and the position sensing element is disposed on a surface of the circuit board that is not parallel to the plane surface; and
 an optical image stabilization mechanism, disposed under and connected to the base, wherein the optical image stabilization mechanism includes a shape memory alloy (SMA) wire assembly configured to force the base and the holder to move.

2. The lens driving device as claimed in claim 1, wherein the base conductive assembly partially overlaps the holder when viewed along the optical axis direction.

3. The lens driving device as claimed in claim 2, wherein the base conductive assembly is partially embedded in the base.

4. The lens driving device as claimed in claim 3, wherein the base conductive assembly further includes an external end connecting portion exposed from the base, wherein the external end connecting portion partially overlaps the holder or the lens element when viewed from the optical axis.

5. The lens driving device as claimed in claim 4, wherein the base further has a sidewall surrounding a base opening of the base where the optical axis extends through, and the external end connecting portion is exposed from the sidewall.

6. The lens driving device as claimed in claim 5, wherein the external end connecting portion is protruding from the sidewall and toward the optical axis.

7. The lens driving device as claimed in claim 6, wherein the base conductive assembly further includes the external end connecting portions surrounding the optical axis.

8. The lens driving device as claimed in claim 1, wherein the optical image stabilization mechanism further has a first circuit board and a second circuit board, and the first circuit board is connected to the base, wherein the SMA wire assembly is configured to drive the first circuit board, the base, and the holder to move relative to the second circuit board.

9. The lens driving device as claimed in claim 8, wherein the SMA wire assembly and the first circuit board are disposed on the second circuit board, and the SMA wire assembly connects the first circuit board to the second circuit board.

10. The lens driving device as claimed in claim 1, wherein the base has a base opening, and the optical axis extends through the base opening, and the SMA wire assembly surrounds the base opening.

11. The lens driving device as claimed in claim 10, wherein the drive mechanism is disposed on the base and configured to force the holder to move relative to the base.

12. The lens driving device as claimed in claim 11, further comprising a plurality of magnetic elements disposed on the holder, wherein the position sensing assembly corresponds to the magnetic elements.

13. The lens driving device as claimed in claim 12, further comprising a frame disposed outside the holder, wherein the drive mechanism includes a coil surrounding the holder and a plurality of driving magnets disposed on an inner wall of the frame, and the driving magnets face the coil which is located between the magnetic elements.

14. The lens driving device as claimed in claim 1, wherein each of the conductive members is disposed on a corner area of the base when viewed along the optical axis direction.

15. A lens driving device, comprising:
a holder, configured to sustain a lens element having an optical axis;
a base, wherein the holder is movable relative to the base;
a base conductive assembly, having a plurality of conductive members disposed on a plane surface that is perpendicular to the optical axis;
a drive mechanism, configured to drive the holder to move relative to the base;
a position sensing assembly, configured to sense the holder to move relative to the base, wherein the position sensing assembly has a position sensing element and a circuit board, wherein the position sensing element is electrically connected to the base conductive assembly via the circuit board, and the position sensing element is disposed on a surface of the circuit board that is not parallel to the plane surface; and
an optical image stabilization mechanism, configured to force the base and the holder to move on a plane perpendicular to the optical axis, wherein the optical image stabilization mechanism includes a first circuit board and a second circuit board, wherein the first circuit board is affixed to the base and is movable relative to the second circuit board.

16. The lens driving device as claimed in claim 15, wherein the first circuit board has at least one positioning member which extends toward the base, and at least one positioning recess is formed on a bottom of the base and corresponding to the position member.

17. The lens driving device as claimed in claim 16, wherein the optical image stabilization mechanism further includes a shape memory alloy (SMA) wire assembly connected to the first circuit board and the second circuit board, and when viewed from a direction that is perpendicular to the optical axis, the SMA wire assembly overlaps the positioning member.

18. The lens driving device as claimed in claim 17, wherein the positioning member is closer to the optical axis than the SMA wire assembly when viewed from the direction that is perpendicular to the optical axis.

19. The lens driving device as claimed in claim 18, wherein an adhesive is applied between the positioning member and the positioning recess.

* * * * *